United States Patent
Rassaian et al.

(10) Patent No.: US 7,840,386 B2
(45) Date of Patent: Nov. 23, 2010

(54) FINITE ELEMENT MODELING METHOD UTILIZING MASS DISTRIBUTION

(75) Inventors: Mostafa Rassaian, Bellevue, WA (US); David W. Twigg, Federal Way, WA (US); Jeffrey Ko, Issaquah, WA (US)

(73) Assignee: The Boeing Company, Chicago, IL (US)

(*) Notice: Subject to any disclaimer, the term of this patent is extended or adjusted under 35 U.S.C. 154(b) by 743 days.

(21) Appl. No.: 11/444,281

(22) Filed: May 30, 2006

(65) Prior Publication Data

US 2007/0282571 A1    Dec. 6, 2007

(51) Int. Cl.
*G06F 17/50* (2006.01)
(52) U.S. Cl. .................. 703/1; 703/2; 703/6; 703/7; 703/8
(58) Field of Classification Search .............. 703/1, 703/2; 716/9; 415/213.1; 188/374
See application file for complete search history.

(56) References Cited

U.S. PATENT DOCUMENTS

| | | | | |
|---|---|---|---|---|
| 4,858,146 | A * | 8/1989 | Shebini | 703/1 |
| 5,574,658 | A | 11/1996 | Ito | |
| 6,044,210 | A * | 3/2000 | Nagtegaal | 716/9 |
| 6,257,829 | B1 * | 7/2001 | Seeley et al. | 415/213.1 |
| 6,697,770 | B1 * | 2/2004 | Nagetgaal | 703/2 |
| 6,871,123 | B2 | 3/2005 | Shimel | |
| 7,249,004 | B2 * | 7/2007 | Lindeman et al. | 703/1 |
| 2003/0172739 | A1 * | 9/2003 | Horiuchi et al. | 73/662 |
| 2003/0229476 | A1 * | 12/2003 | Naganarayana et al. | 703/2 |
| 2003/0230443 | A1 * | 12/2003 | Cramer et al. | 180/65.5 |
| 2004/0011615 | A1 * | 1/2004 | Ray et al. | 188/374 |
| 2004/0172223 | A1 * | 9/2004 | Lindeman et al. | 703/1 |
| 2004/0195439 | A1 * | 10/2004 | Hamamoto et al. | 244/72 |
| 2006/0141232 | A1 * | 6/2006 | Ma | 428/292.1 |
| 2006/0259283 | A1 * | 11/2006 | Brughmans et al. | 703/2 |
| 2007/0016388 | A1 * | 1/2007 | Shimel et al. | 703/1 |
| 2007/0289301 | A1 * | 12/2007 | Taya et al. | 60/527 |

OTHER PUBLICATIONS

Gendy et al. Optimization of Space Station components using design code CometBoards Computer Methods Applied Mech. Engineering, 129, 1996, pp. 133-149.*
R Eric Dyke, Glenn A. Hrinda Structural Design for a Neptune Aerospace Mission AIAA Atmospheric Flight Mechanics Conference, 2004—Citeseer.*
Brunetto et al. OWL opto-mechanics; Ground-based Telescopes, edited by Jacobus M. Oschmann Jr., Proc. SPIE vol. 5489 (SPIE, Bellingham, WA 2004).

* cited by examiner

*Primary Examiner*—Hugh Jones
*Assistant Examiner*—Cuong V Luu
(74) *Attorney, Agent, or Firm*—Klintworth & Rozenblat IP LLC (57) ABSTRACT

The invention discloses differing embodiments of finite element modeling methods utilizing mass distribution to model an object. In one embodiment, the finite element model of the object may be partitioned into sub-models. A determination may be made as to which elements in the finite element model are structural and as to which elements in the finite element model are non-structural. Mass properties for both the structural and non-structural elements in each sub-model may be determined. The significant non-structural masses within each sub-model may be selected and added to the finite element model. The remaining insignificant, non-structural masses may be incorporated onto the structural masses by scaling densities of the structural masses. The scaled structural masses may then be added to the finite element model. In other embodiments, objects are provided which were modeled utilizing finite element models under the invention.

8 Claims, 7 Drawing Sheets

Structural Body Weight Statement Data

Section 22

| ITEM | LEVEL | WEIGHT | XCG | YCG | ZCG |
|---|---|---|---|---|---|
| BODY SECTION 46 | 1 | 1034.25 | 1346.742 | 55.537 | 202.086 |
| SKIN STR. FAST. SPL. REINF. SEC 46 | 2 | 611.60 | 1344.971 | 56.431 | 201.400 |
| SKIN | 3 | 344.33 | 1344.518 | 58.331 | 210.599 |
| STRINGERS, FASTENERS, TEAR STRAPS, INST. | 3 | 267.27 | 1345.554 | 53.984 | 189.548 |
| FRAMES SECTION 46 | 2 | 124.33 | 1347.133 | 59.582 | 198.595 |
| FRAMES | 3 | 124.33 | 1347.133 | 59.582 | 198.595 |
| FLOOR PANELS SECTION 46 | 2 | 57.27 | 1356.500 | 46.390 | 199.500 |
| FLOOR PANELS | 3 | 57.27 | 1356.500 | 46.390 | 199.500 |
| FLOOR SUPPORTS SECTION 46 | 2 | 171.80 | 1350.440 | 41.592 | 196.725 |
| FLOOR SUPPORTS | 3 | 171.80 | 1350.440 | 41.592 | 196.725 |
| WINDOWS SECTION 46 | 2 | 44.14 | 1344.400 | 96.309 | 240.802 |
| WINDOWS | 3 | 44.14 | 1344.400 | 96.309 | 240.802 |
| ACC.,SEAL.,DRAIN.,PROT., CORR.,INT.,PRR | 2 | 25.1 | 1344.518 | 58.331 | 210.599 |
| PROTECTIVE FINISH, ETC. | 3 | 25.11 | 1344.518 | 58.331 | 210.599 |

TOTALS FOR SECTION WEIGHT = 1034.25  $X_{CG}$ = 1346.742  $Y_{CG}$ = 55.537  $Z_{CG}$ = 202.086

FIG. 4

Stowage Bin, Passenger and Cargo Loads

| Section No. 22 | Weight | Xcg | Ycg | Zcg |
|---|---|---|---|---|
| Passenger | 3315.4 | 1345.5 | 0.0 | 227.0 |
| Stowage bins | 254.1 | 1345.5 | 0.0 | 275.0 |
| Cargo | 2802.2 | 1345.5 | 0.0 | 160.0 |

FIG. 5

Non-Structural Weight Statement

Section 22

| ITEM | LEVEL | WEIGHT | XCG | YCG | ZCG |
|---|---|---|---|---|---|
| BODY STUFFED OEW | 1 | 2298.47 | 1345.442 | -0.156 | 224.512 |
| FC 24 APU | | | | | |
| APU-RS TO APU ASSEMBLY | 2 | 55.02 | 1345.500 | 0.016 | 200.000 |
| APU-EE BAY TO APU ASSEMBLY | 3 | 41.48 | 1345.500 | 0.000 | 200.000 |
| | 3 | 13.55 | 1345.500 | 0.066 | 200.000 |
| FC 28 SURFACE CONTROLS IN BODY | 2 | 46.29 | 1345.500 | 0.000 | 277.500 |
| SURFACE CONTROLS-FLT DECK TO AFT BLKHD | 3 | 6.43 | 1345.500 | 0.000 | 200.000 |
| SURFACE CONTROLS-FLT DECK TO TAIL | 3 | 39.86 | 1345.500 | 0.000 | 290.000 |
| FC 29 HYDRAULICS IN BODY | 2 | 80.37 | 1345.500 | 0.000 | 200.000 |
| HYDRAULICS- WHEEL WELL TO AFT BLKHD | 3 | 80.37 | 1345.500 | 0.000 | 200.000 |
| FC 32 ELECTRICAL IN BODY | 2 | 50.68 | 1345.500 | 0.000 | 235.000 |
| ELECTRICAL-DISTRIBUTED | 3 | 50.68 | 1345.500 | 0.000 | 235.000 |
| FC 33 ELECTRONICS IN BODY | 2 | 52.22 | 1345.500 | 0.000 | 235.000 |
| ELECTRONICS-DISTRIBUTED | 3 | 52.22 | 1345.500 | 0.000 | 235.000 |
| FC 35 PASSENGER ACCOMODATIONS | 2 | 1371.82 | 1345.412 | 0.001 | 243.464 |
| PASSENGER SEATS | 3 | 635.53 | 1345.478 | 0.000 | 227.000 |
| PASSENGER SERVICE UNITS | 3 | 65.66 | 1345.500 | 0.000 | 275.000 |
| FLOORING | 3 | 65.38 | 1345.500 | 0.000 | 200.000 |
| LINING-SIDEWALL & CEILING | 3 | 167.12 | 1345.500 | 0.003 | 254.153 |
| OVEWRHEAD SUPORT STRUCTURE | 3 | 9.60 | 1345.081 | 0.000 | 275.000 |
| OVERHEAD STOWAGE BINS | 3 | 224.39 | 1345.500 | 0.000 | 257.000 |
| INSULATION | 3 | 80.71 | 1345.500 | 0.000 | 274.927 |
| LIGHTING | 3 | 50.29 | 1345.500 | 0.003 | 254.153 |
| WATER LINES | 3 | 14.88 | 1345.500 | 0.000 | 200.000 |
| WASTE LINES | 3 | 18.17 | 1345.500 | 0.000 | 200.000 |
| MIS.PASSENGER ACCOMODATIONS | 3 | 40.08 | 1342.945 | 0.003 | 254.152 |
| FC37 CARGO/BAGGAGE SYSTEM | 2 | 348.18 | 1345.466 | -1.019 | 142.984 |
| AFT CARGO COMPARTMENT | 3 | 348.18 | 1345.466 | -1.019 | 142.984 |
| FC 39 ENVIROMENTAL CONTROL SYSTEM | 2 | 91.05 | 1345.500 | -0.065 | 251.957 |
| ECS PASSENGER CABIN DISTRIBUTION | 3 | 91.05 | 1345.500 | -0.065 | 251.957 |
| FC 97 STANDARD & OPERATIONAL ITEMS - BODY | 2 | 202.84 | 1345.500 | 0.001 | 222.913 |
| OXYGEN | 3 | 19.40 | 1345.500 | 0.000 | 275.000 |
| PASSENGER SERVICE EQUIPMENT | 3 | 58.96 | 1345.500 | 0.003 | 254.153 |
| EMERGENCY EQUIPMENT - OPERATIONAL ITEMS | 3 | 124. | 1345.500 | 0.000 | 200.000 |

TOTALS FOR SECTION WEIGHT = 2298.47  $X_{CG}$ = 1345.442
$Y_{CG}$ = -0.156  $Z_{CG}$ = 224.512

FIG. 6

|  | Weight (lb) | Xcg | Ycg | Zcg | Ixx(10⁶) | Iyy(10⁶) | Izz(10⁶) |
|---|---|---|---|---|---|---|---|
| Unscaled Structural FEM | 1,378.97 | 1342.01 | -0.09 | 197.78 | - | - | - |
| Scaled Densityh Structural FEM | 3,082.64 | " | " | " | - | - | - |
| Lump Mass | 7,655.42 | 1345.50 | -0.04 | 201.20 | - | - | - |
| Combined FEM by Panel Mass | 10,740.86 | 1344.51 | -0.03 | 200.76 | 49.96 | 41.74 | 35.33 |
| Weight Statement | 10,738.30 | 1345.70 | 0.00 | 205.30 | 55.52 | 38.78 | 42.86 |

|  | Ixx(10⁶) | Iyy(10⁶) | Izz(10⁶) |
|---|---|---|---|
| Combined FEM by Panel Mass | -0.01 | -.22 | .03 |
| Weight Statement | 0.00 | .11 | -.02 |

FINITE ELEMENT MODELING METHOD UTILIZING MASS DISTRIBUTION

BACKGROUND OF THE INVENTION

In finite element modeling applied to structural analysis, the object under analysis is idealized as a collection of small elements interconnected at the nodal grids. There are two basic element classes, structural elements and mass elements. Structural elements, for example beam elements, have both stiffness (strength) and mass properties. Mass elements, for example lumped masses, have mass properties only. It is convenient to divide an object into structural and non-structural components for purposes of modeling its behavior. Structural components are modeled by structural elements, and non-structural components are modeled by mass elements. For example, in modeling an airplane fuselage, the structural component would typically comprise the fuselage, the beams, skin and floor, and the non-structural component would typically comprise the cargo, seats, passengers, contents of overhead bins, et cetera.

In many traditional finite element modeling methods, the non-structural components of the object are modeled by connecting lumped masses to the structure through rigid bars. The rigid bars offset the center of mass so that the lumped mass location corresponds to the center of mass of the object being modeled. This process may be labor intensive, difficult, costly, timely, inefficient, inaccurate, and/or may experience divergence during solution phase.

A finite element modeling method is needed which may solve one or more problems in one or more of the existing finite element modeling methods.

SUMMARY OF THE INVENTION

In one aspect of the invention, a method for modeling mass in a finite element model is disclosed. An object may be partitioned into sub-objects, and the mass properties of each sub-object may be determined. The structural and non-structural components of each sub-object may be identified. A finite element model may be constructed for the structural components of the sub-object using structural elements. The non-structural components may be further partitioned into significant and insignificant components. The significant components may be modeled by mass elements that are added to the finite element sub-model. The insignificant components may be modeled by scaling the densities of the structural finite elements of the sub-model. The result may be a finite element model for the object in which the mass distribution is approximately correct. Accuracy of the mass distribution may be improved by modeling more of the insignificant components by mass element or by a finer partition of the object into sub-objects. It may be convenient to construct the structural model for the entire object prior to adding the mass elements of the sub-objects. In that case, the structural elements that belong to each sub-object may be identified.

In another aspect of the invention, another method is disclosed for partitioning mass in a sub-model into significant categories and calculating the factor for scaling the density of the structural elements to correct the mass properties of the model. A selection criterion for selecting significant non-structural masses in a sub-model may be that the mass exceed one of a fixed fraction of the mass of the object or a fixed percentage of mass. The remaining insignificant, non-structural masses within each sub-model, which may comprise the non-structural masses which do not exceed the at least one pre-determined mass and the pre-determined percentage of mass, may be incorporated onto the structural masses in each sub-model by scaling densities of the structural elements in the sub-model by a factor of R. The factor of R may be calculated using the formula $R=(WT-WM)/WS$. WT may represent the total mass of the sub-model of the object. WM may substantially comprise a summation of all significant, non-structural masses in the sub-model. WS may substantially comprise a summation of all structural masses in the sub-model.

Figure 1:
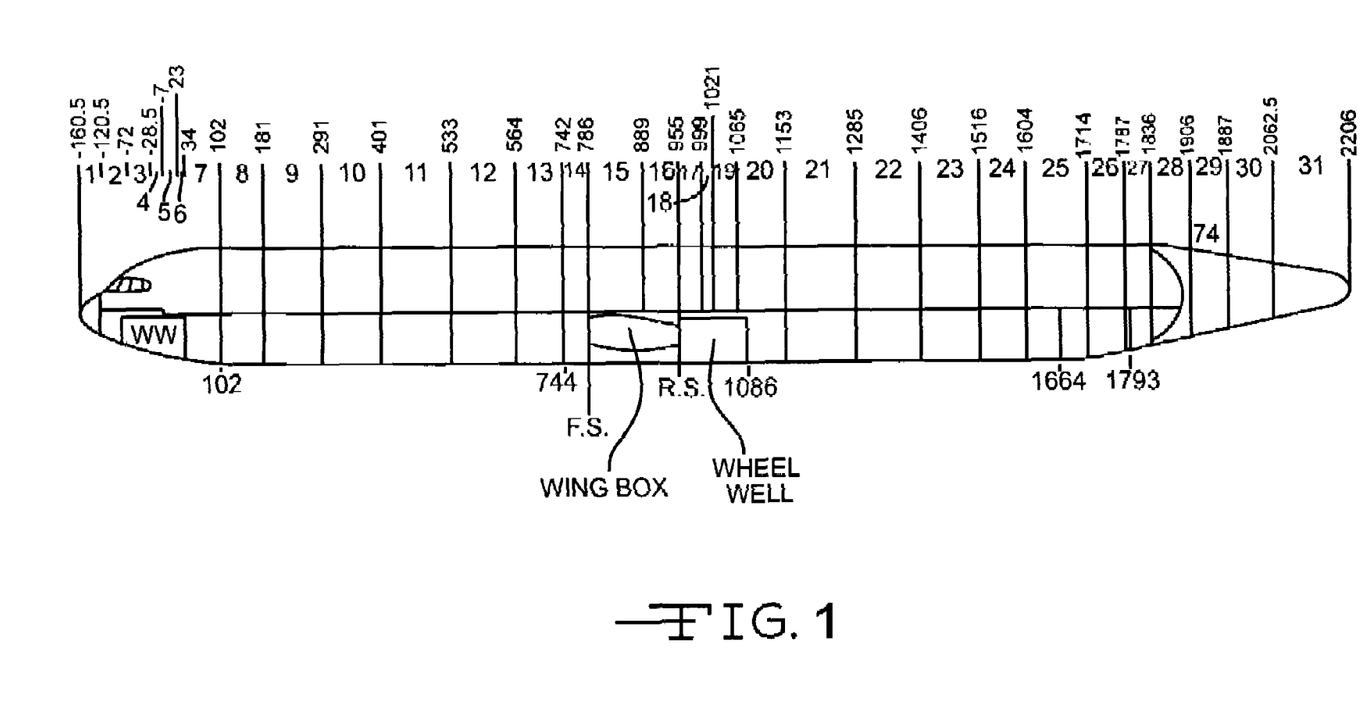
FIG. 1 shows a front view of the partitioning of a fuselage into multiple sub-models under one embodiment of the invention.

The finite element sub-models may be connected through nodal constraints or node sharing. Node sharing (sharing nodes between sub-models) may be easier to implement. To this end it may be convenient to construct the structural model for the entire object and then define sub-models according to the finite element grid. In this event, it may be necessary to identify the sub-model to which each structural element belongs. In the example of FIG. 1, sub-models were defined by parallel vertical slices. If the geometric centroid of a structural element fell within a slice, the entire element was considered to belong to the sub-model defined by the slice.

The densities of all structural components in a sub-model may be scaled. It may be possible to further subdivide the non-structural elements into subgroups and match the subgroups to subgroups of the structural elements. For example, the structural finite elements modeling a floor might be scaled to account for the carpet.

In a further aspect of the invention, an object is provided which was modeled using a finite element model. During the finite element modeling of the object, the finite object may have been partitioned into sub-models. A determination may have been made as to which components in the sub-model were structural and as to which components were non-structural. Another determination may have been made as to mass properties for the sub-model and the structural and non-structural components in each sub-model. A finite element model of the sub-model may have been constructed, modeling the structural components with structural elements and the significant components with mass elements. The remaining insignificant non-structural masses may have been incorporated onto the sub-model by scaling densities of the structural elements.

These and other features, aspects and advantages of the invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

One embodiment of the invention may comprise a method for setting up a finite element model in order to model both structural and non-structural components of an object. The finite element model may then be utilized to perform dynamic analysis to determine how the object being analyzed will react in response to static and/or dynamic loads. The invention may be utilized in both airplane and non-airplane applications to determine varying types of object reactions.

In one embodiment of the invention, the object being analyzed may be subdivided into structural and non-structural components. The structural components may comprise components which substantially contribute to the strength of the object's structure, such as an airplane's skin, stringers, and frame system. The structural components may comprise the "skeleton" of the fuselage (i.e.: frames, stringers, doors, skin, windows, etc.) and the non-structural components may comprise everything else. The non-structural components may comprise components which do not contribute substantially to the strength of the object's structure. The non-structural components may be considered secondary structures such as overhead bins, control surfaces, payload, systems, fuel, landing gear, APU, interior monuments, bulkheads, galleys, lavatories, seats, lower lobe cargo, and other types of non-structural components. In other embodiments, the structural and non-structural components of the object being analyzed may vary.

The finite element model of the object being analyzed may be partitioned into a plurality of sub-models. For each sub-model, the mass properties may be determined for both the individual structural and individual non-structural masses of the sub-model. The total mass of the sub-model may be calculated, which may include both the structural and non-structural masses in the sub-model, with the symbol WT representing the sub-model's total mass.

Based on the mass determinations, the significant, non-structural masses throughout the sub-model may be identified. The significant, non-structural masses may be identified based on exceeding a certain percentage of the object's mass, exceeding a certain mass, or using another varied identification method. The significant, non-structural masses may be identified, may be modeled by mass elements that locate the center of mass of the mass elements, and may be added to the finite element sub-model. In such manner, the center of mass for each significant, non-structural mass may be located near its true location in the finite element sub-model. The sum of the significant, non-structural masses in the sub-model may be calculated, with the symbol WM representing the sum of those significant, non-structural masses.

The remaining insignificant, non-structural masses may be incorporated onto the structural elements (masses) in the sub-model by scaling the densities of the structural elements in the sub-model. The remaining insignificant, non-structural masses may comprise the non-structural masses which are not significant as determined previously. The remaining insignificant, non-structural mass may be identified based on being below a certain percentage of the object's mass, being below a certain mass, or using another varied identification method. By scaling the insignificant, non-structural masses onto the structural elements (masses) of the sub-model, a substantial amount of the non-structural weight may be accommodated for without having to individually calculate the center of gravity for each insignificant mass in the sub-model. In such manner, the invention may improve timeliness, efficiency, cost, and/or improve other issues in the prior art. The scaled structural masses may then be added to the finite element model. Varying embodiments of the invention may utilize one or more finite element models in order to carry out the methods of the invention.

In one embodiment, the densities of the structural elements (or masses) in the sub-model may be multiplied (or scaled) by a factor of R which may be calculated using the formula $R=(WT-WM)/WS$, where WT substantially comprises a summation of all structural and non-structural masses in the sub-model, WM substantially comprises a summation of all significant, non-structural masses in the sub-model, and WS substantially comprises a summation of all structural masses in the sub-model. In other embodiments, the densities of the structural elements in the sub-model may be scaled based on a varied calculation, which may be dependent on mass and/or density breakdowns within the sub-model or on other criteria.

One embodiment of the invention as it is applied to model a sub-model of an airplane is provided below. The structural weight of a finite element model in an airplane may be about 50% of the operating empty weight of the airplane. The finite element model representing the primary structure of the airplane may not account for non-structural components such as lavatories, galleys, insulation blankets, electrical wiring, hydraulics, fuel, passengers, cargo, and varying other types of non-structural components. The passenger load may be in the vicinity of 65% of the total load. An itemized weight statement may be provided for the entire airplane which may include all the nonstructural weight components for the entire airplane.

The itemized weight statement may partition the airplane into four major groups comprising the fuselage, wing, horizontal stabilizer, and vertical stabilizer. Each major group may be further subdivided into sub-models. For instance, the fuselage may be divided into 31 sub-models, the wing may be divided into 11 sub-models, the horizontal stabilizer may be divided into 13 sub-models, and the vertical tail may be divided into 11 sub-models. FIG. 1 shows an example of sub-model partitioning of the fuselage. Each sub-model may have an itemized weight breakdown for all the components in the sub-model including components such as insulation, fasteners, wiring, and other types of components. In addition to the weight breakdowns for each component, the center of gravity locations may also be provided for each sub-model component.

Figure 2:
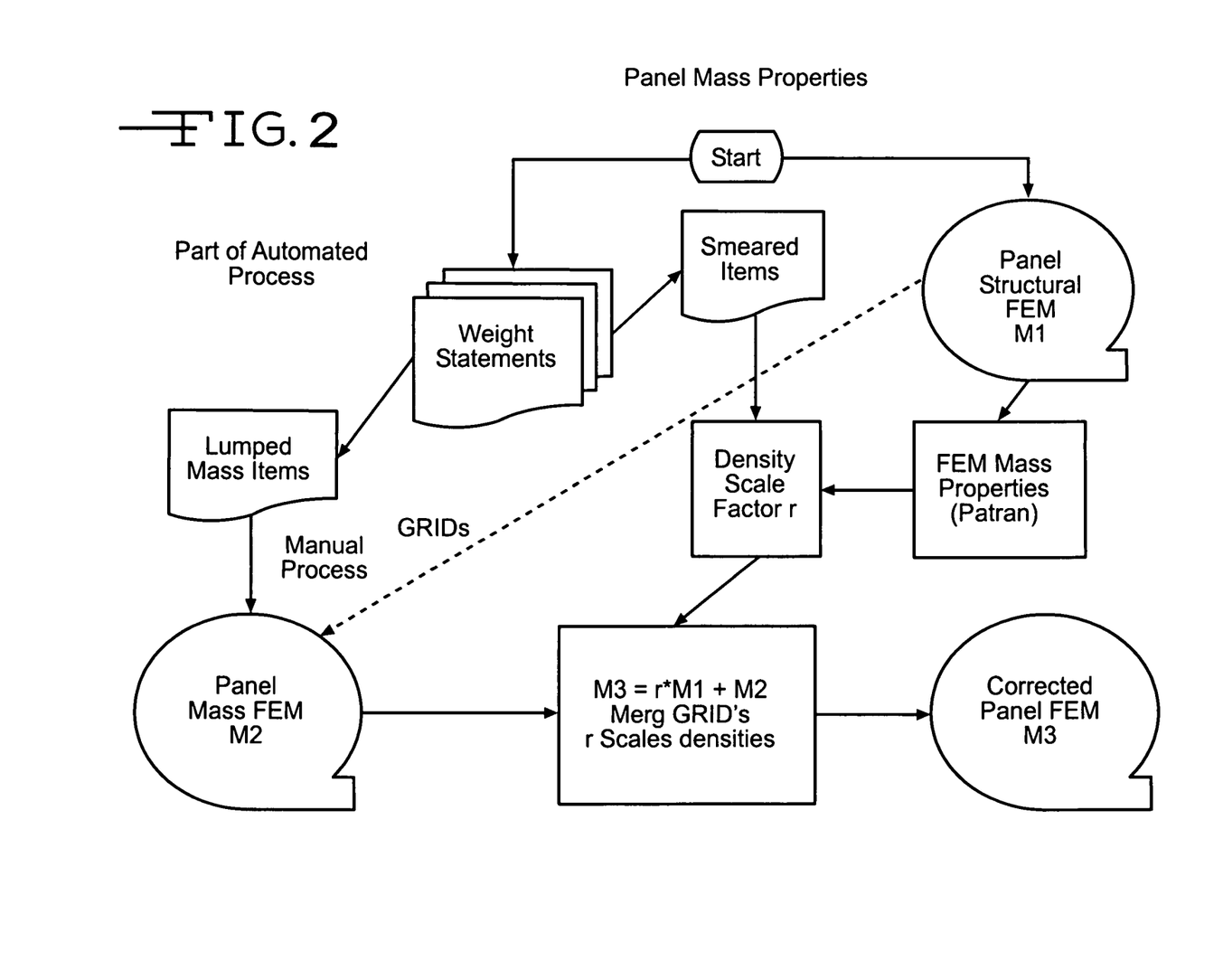
FIG. 2 depicts a flow chart diagram showing one embodiment of a method under the invention which may be applied to prepare a finite element model of an object.

A flow chart diagram is shown in FIG. 2 depicting one embodiment of a method under the invention which may be applied to the finite element model of the airplane. Initially, a finite element model of the primary structure may be determined. Weight statements may be obtained for both the structural and non-structural components in each sub-model. Non-structural components in each sub-model may be sorted into two categories including significant masses which may require explicit modeling by rigid bars and lumped masses, and insignificant masses which may be density scaled onto the structural masses under the disclosed methods of the invention.

A second finite element model may be constructed including the significant masses of the non-structural components in each sub-model such as stowage bins, passenger weights, cargo weights, and other types of significant, non-structural masses. The second finite element model may be constructed utilizing rigid bars and lumped masses, using the nodes of the primary structure finite element model. Material densities of the primary structure finite element model may be scaled to a target weight to accommodate for the insignificant non-structural mass in each sub-model. The target weight may be obtained from the determined weight statements by adding the weights of the non-structural, insignificant components to the primary structure weight. The scaled primary structure finite element model and the lumped mass finite element model may then be merged into one finite element model.

A windows-based computer program, PanelMass, may be used to automate this procedure. In other embodiments, one or more computers or software may implement the methods of the invention. Construction of the lumped mass finite element model may be done manually. All other steps, including scale factor calculation and finite element model merging may be automated. The PanelMass program may invoke PATRAN to obtain mass properties from both the primary structural finite element model and the lump mass finite element model.

Figure 3:
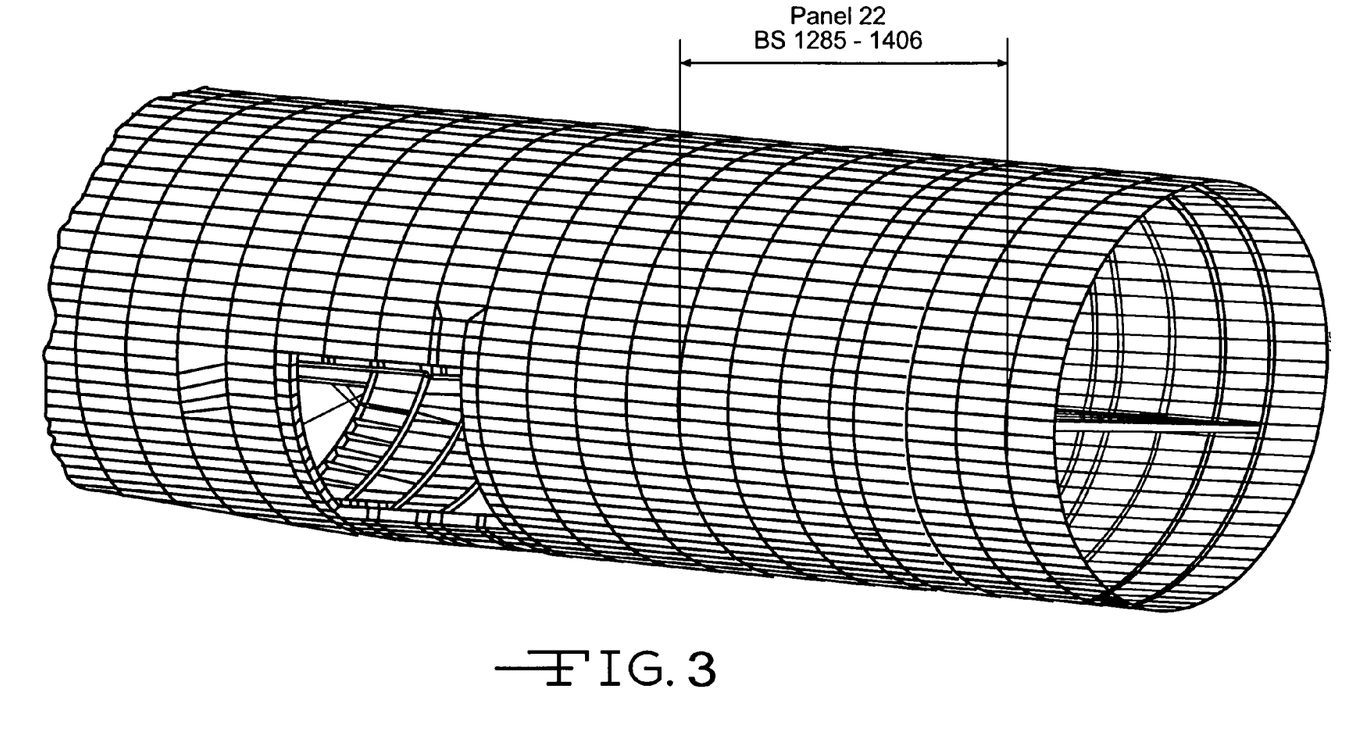
FIG. 3 depicts the partitioning of sub-model 22 in a 767-400 ER airplane under one embodiment of a method under the invention.
Figure 4:
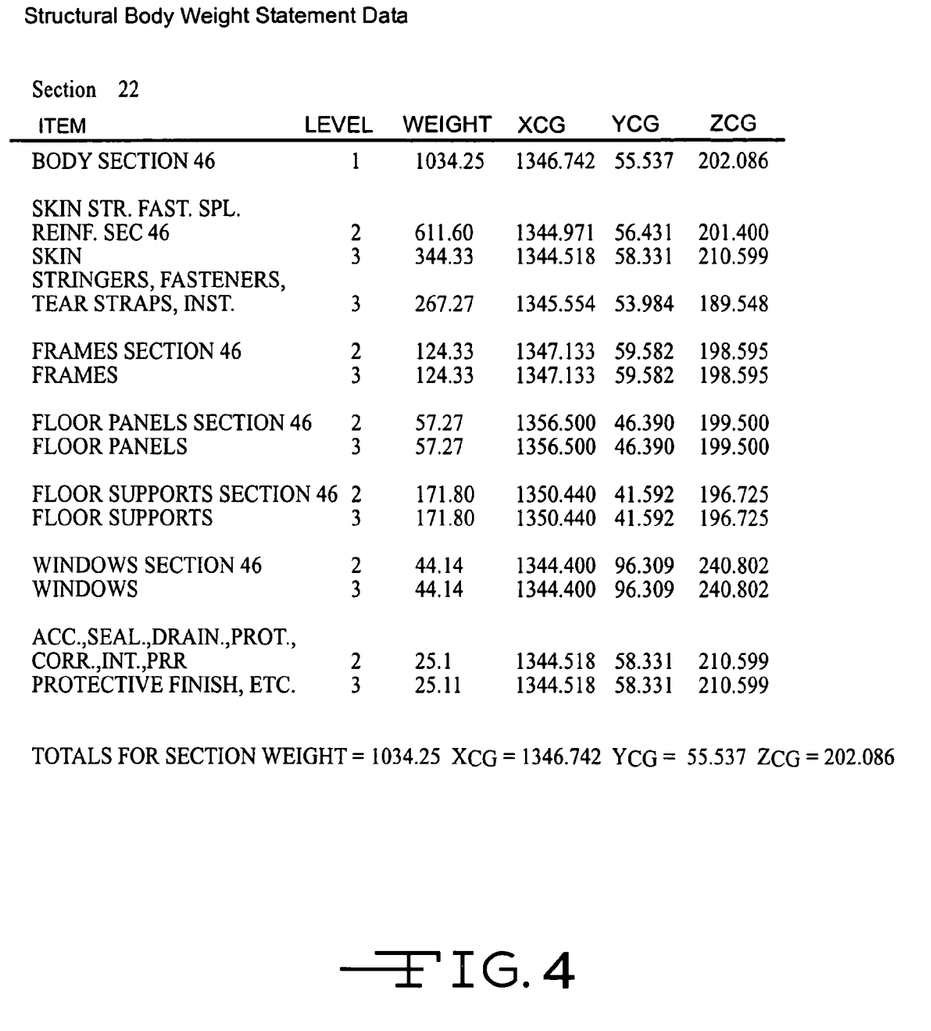
FIG. 4 depicts structural weight statement data which was taken with respect to sub-model 22 of FIG. 3.
Figure 5:
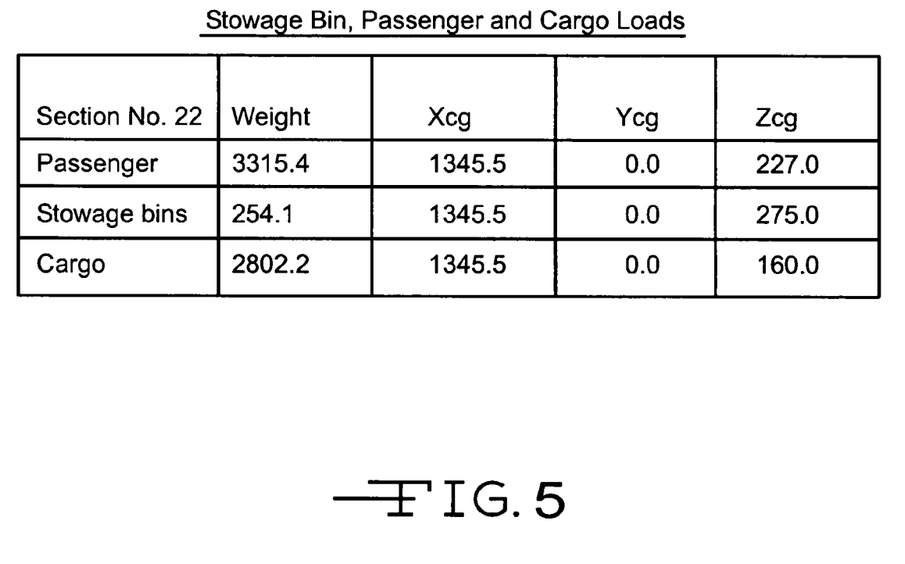
FIG. 5 depicts stowage bin, passenger and cargo load weight statement data which was taken with respect to sub-model 22 of FIG. 3.
Figure 6:
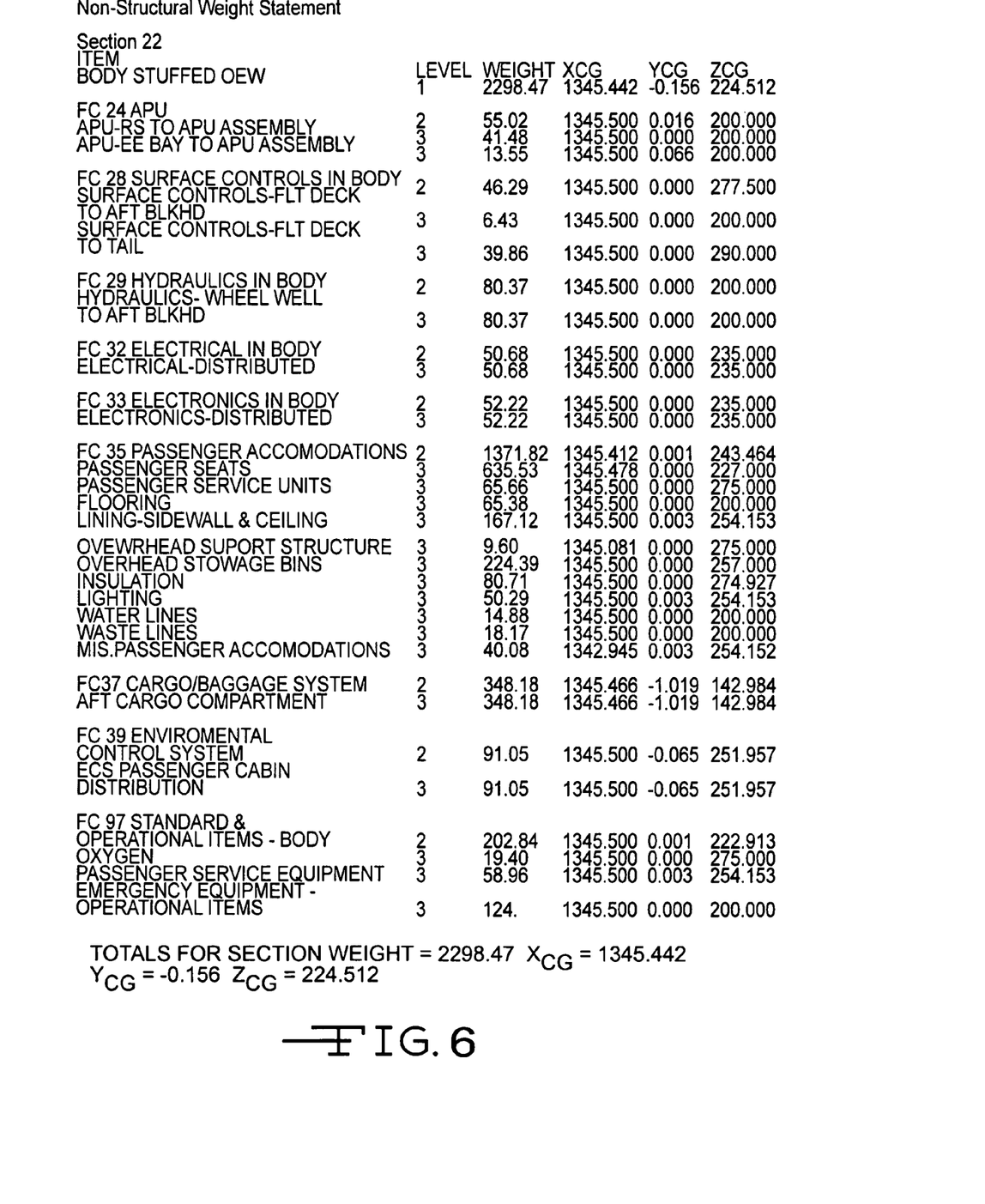
FIG. 6 depicts non-structural weight statement data which was taken with respect to sub-model 22 of FIG. 3.

To demonstrate one embodiment of the method with respect to a sub-model of a partitioned airplane model, the method was applied to sub-model number 22 of a partitioned 767-400ER airplane model, as depicted in FIG. 3. As depicted, the finite element model consists of 5011 elements, 1719 nodes, and 46 materials. As shown, sub-model 22 spans from BS 1285 to 1406. Under the method, weight statements were taken for the structural and non-structural components in sub-model 22. Those weight statements are provided in the tables of FIGS. 4, 5, and 6.

In the 767-400 ER airplane model, the majority of the finite element model is aluminum. The other materials are along the window belt region and the cargo and passenger floors. To simplify the process of adding density values, all materials other than aluminum were replaced with aluminum.

Figure 7:
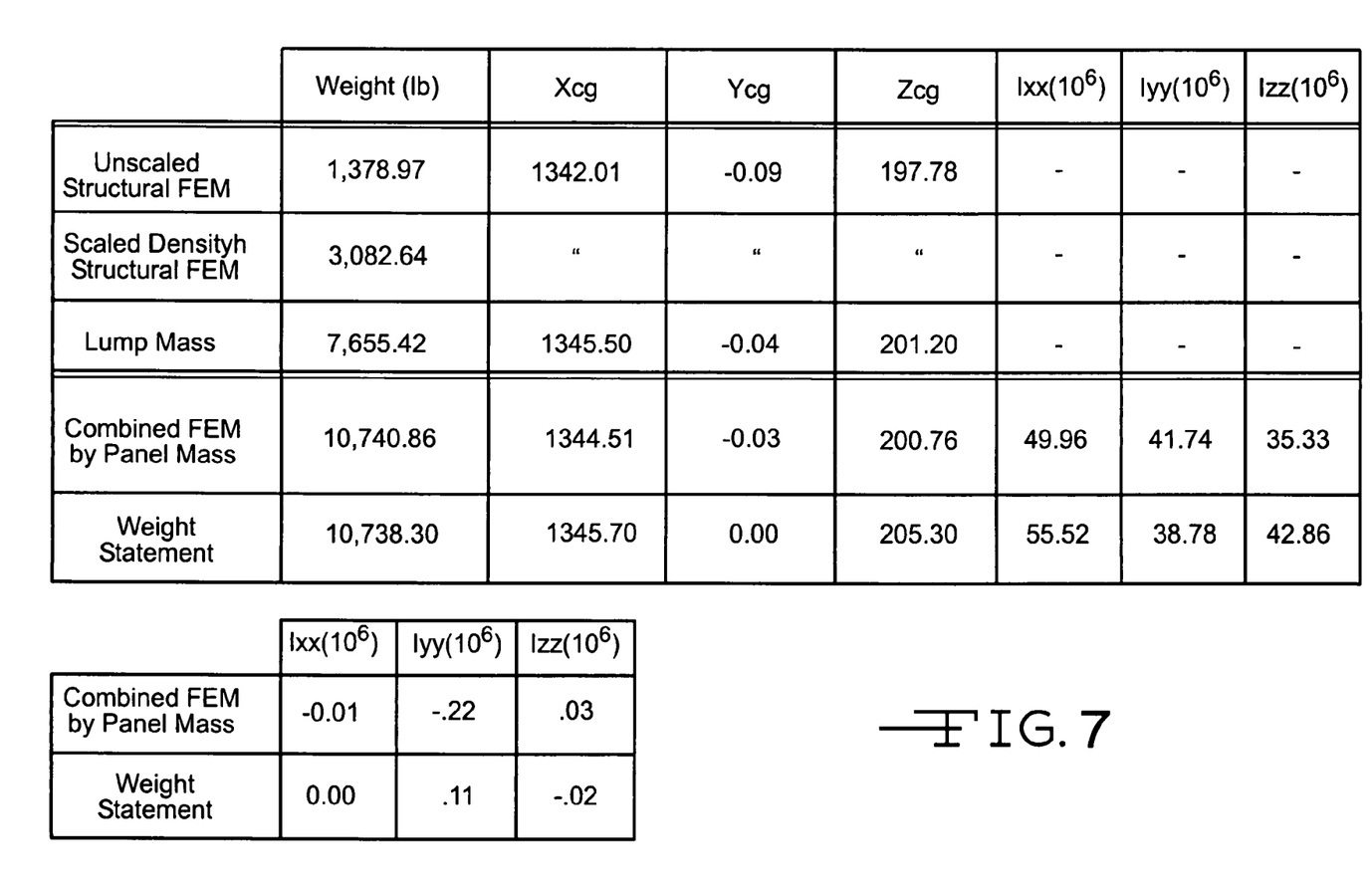
FIG. 7 depicts a table showing the results of using one embodiment of the method of the invention to prepare a finite element model of sub-model 22 in FIG. 3.

FIG. 7 depicts a table showing the results of using the method on sub-model 22. As shown, the unscaled structural finite element model weight, which comprises the unscaled weight of the structural components, came to 1,378.97 pounds with a center of gravity of $Xcg=1,342.01, Ycg=-0.09$, and $Zcg=197.78$. The scaled density structural finite element model weight, which comprises the scaled weight of the structural components to account for the weight of the insignificant, non-structural components, came to 3,082.64 pounds with a density scaling factor of 2.235472 and an identical center of gravity. The lump mass weight, which comprises the weight of the significant, non-structural components, came to 7,655.42 pounds with a center of gravity of $Xcg=1345.40, Ycg=-0.04$, and $Zcg=201.20$.

The combined finite element model weight, which incorporates both the weight of the scaled density structural finite element model and weight of the lump mass model, came 10,740.86 pounds with a center of gravity of $Xcg=1,344.51$, $Ycg=-0.03$, and $Zcg=200.76$, and moments of inertia of $Ixx (10^6)=49.96$, $Iyy (10^6)=41.74$, $Izz (10^6)=35.33$, $Ixy (10^6)=-0.01$, $Ixz (10^6)=-0.22$, and $Iyz (10^6)=0.03$. A check of the known weight statements of sub-model 22 was done to verify the accuracy of the method. Sub-model 22's weight statement came to 10,738.30 pounds with a center of gravity of $Xcg=1,345.70, Ycg=0.00$, and $Zcg=205.30$, and moments of inertia of $Ixx (10^6)=55.52$, $Iyy (10^6)=38.78$, $Izz (10^6)=42.86$, $Ixy (10^6)=0.00$, $Ixz (10^6)=0.11$, and $Iyz (10^6)=-0.02$. A comparison of the known weight statement values with the combined finite element model values reveals that the method of the invention provides accurate weights, centers of gravity, and moments of inertia.

It should be noted that the difference in the Zcg center of gravity values and the Izz values, in the known weight statement and the combined finite element model of the invention, was due to the changing of the material density of the passenger and cargo floor from fiberglass to aluminum. It should further be noted that the landing gear of the airplane was not part of the smearing process. The demonstrated method which was demonstrated on sub-model 22 of the airplane's fuselage may also be applied to the wing and to other parts of the airplane. For purposes of the example, fuel was not included but could be added through the use of discrete lump masses in the wing and center sub-models similar to the process used for passenger and cargo loading.

As demonstrated, the method of the invention may provide an accurate and effective method for providing mass distribution in a finite element model. This method may be utilized for the 7E7 wheels up landing project, and other dynamic problems such as flutter and engine vibration related noise. In other embodiments, varying methods of the invention may be applied to differing types of objects in varying applications, both in and out of the aeronautical field.

It should also be noted that during finite element modeling in one or more embodiments practicing the invention, a grid may be superimposed on the object to be modeled. To complete the model, finite elements connected at grid points may be added. The elements may be assigned strength properties and/or mass properties, and the resulting assemblage may be used to predict the response of the object to various loading conditions. Under the invention, elements with both mass and strength properties may be termed structural elements, and elements with only mass properties may be termed non-structural elements. Non-structural elements may be employed to model components that contribute to the mass of the structure but have insignificant contribution to its strength. Electrical wires, paint and insulation are examples of components that might be modeled using non-structural elements.

Accurate analysis regarding an object's dynamic behavior requires that the distribution of mass in the model be substantially correct. Non-structural element modeling may be utilized to distribute insignificant, non-structural masses, like paint and insulation, without substantially distorting the mass distribution by increasing the density of the structural elements to which they are attached. It may be desirable to approximate other non-structural masses which are greater in value by density scaling to make the model size tenable. However, representing such masses by density scaling may alter the distribution of mass in the model.

Some embodiments of the invention may increase the scope of density scaling techniques. The finite element model may be divided into regions, with each region containing many finite elements, and the density of structural elements in each region may then be scaled according to the mass properties of the insignificant massed, non-structural elements in the region that is being modeled. At the same time, the significant, non-structural masses may be manually entered into the finite element model.

In some embodiments, engineering judgment may be required to decide which non-structural elements may be approximated by density scaling and which should be retained in the model. Some of this judgment may comprise common sense. For instance, distributed elements like wires should be smeared, as should very small masses like rivets, whereas large masses located in a small region should be modeled as lumped masses. If an element has some damping characteristics that influences the dynamic response it may need to be modeled explicitly. Elements that don't contribute to energy absorption (e.g., fuel) may be considered non-structural and may be smeared.

The accuracy of the engineer's judgment may be checked by remodeling the object into smaller sub-models to check to see if the model response substantially changes. If the model response does substantially change, smaller sub-models may be utilized and more non-structural elements may be manually entered into the finite element model in order to provide accurate data. A standard engineering technique for comparing dynamic models is to plot the cumulative number of modes (resonances) versus frequency up to an upper bound appropriate to the model and to then compare the curves. Remodeling is an iterative process that can be used until the model response does not change within an objectively determinable amount to ensure the accuracy of the method. In such manner, the distortion caused by density scaling to the region may be reduced, thus reducing the distortion in the overall model. In this way, a compromise may be achieved that reduces the number of non-structural finite elements in the overall model while maintaining an approximately correct mass distribution.

In the sub-model 22 example provided above, a single region-based scale factor was applied to the density of all structural elements in each region. This provided sufficient accuracy for purposes of the example. In other embodiments, different scaling factors may be applied to different element groups in a region, for example scaling only the external elements in the model to simulate the paint. This may provide more accuracy, but the extra work may not be justified in some embodiments.

In other embodiments of the invention, an object may be provided which was modeled using a finite element model. The finite element model may have been arrived at utilizing any of the above disclosed methods of the invention in order to model the object. In one embodiment, during the finite element modeling of the object, the finite element model may have been partitioned into sub-models. A determination may have been made as to which elements in the finite element model were structural and as to which elements in the finite element model were non-structural. Another determination may have been made as to the mass properties for both the structural and non-structural elements in each sub-model. The significant non-structural masses within each sub-model may have been selected and added to the finite element model. The remaining insignificant non-structural masses may have been incorporated onto the structural masses in each sub-model by scaling densities of the structural masses. The scaled structural masses may have been added to the finite element model.

One or more embodiments of the disclosed methods of the invention may solve one or more problems of one or more existing methods. The invention may be easy to implement, may increase efficiency, may decrease costs, may increase time savings, may increase accuracy, and/or may provide other improvements.

It should be understood, of course, that the foregoing relates to exemplary embodiments of the invention and that modifications may be made without departing from the spirit and scope of the invention as set forth in the following claims.

We claim:

1. A computer-implemented method for modeling mass of an object in a dynamic finite element model in order to obtain an iterative dynamic vibrational analysis, the method comprising the steps of:

obtaining a weight statement that provides the mass of components in the object broken down by groups of the object;

partitioning a finite element model of the object into sub-models according to the groups identified by the weight statement;

determining which components of the object are structural and therefore comprise structural masses, and which components of the object are non-structural and therefore comprise non-structural masses;

determining the non-structural masses within each sub-model which are significant by selecting the non-structural masses within each sub-model which exceed at least one of a pre-determined mass or a pre-determined percentage of a mass of the object, and modeling said significant non-structural masses within each sub-model by adding said significant, non-structural masses to the respective finite element sub-models;

determining the non-structural masses within each sub-model which are insignificant by selecting the non-structural masses within each sub-model which do not exceed at least one of the pre-determined mass or the pre-determined percentage of the mass of the object, and scaling densities of the structural masses in each sub-model of the finite element model to accommodate for the respective insignificant masses within each sub-model;

merging the sub-models into the finite element model to obtain a dynamic finite element model of the object;

obtaining a response of the dynamic finite element model of the object; and repeating the method using smaller sub-models until the response of the dynamic finite element model of the object meets accuracy requirements in order to obtain an iterative dynamic vibrational analysis.

2. The computer-implemented method of claim 1 wherein the computer-implemented method is applied to model a portion of an airplane.

3. The computer-implemented method of claim 1 wherein the computer-implemented method is applied to model a non-aeronautical object.

4. The computer-implemented method of claim 1 wherein the step of partitioning the finite element model of the object into the sub-models according to the groups identified by the weight statement comprises partitioning at least one of a fuselage, a wing, a horizontal stabilizer, and a vertical stabilizer of an airplane into the sub-models.

5. The computer-implemented method of claim 1 wherein the step of determining which of the components of the object are structural and therefore comprise the structural masses, and which of the components of the object are non-structural and therefore comprise non-structural masses comprises determining which of the components of the object contribute to a strength of a structure of the object and are therefore structural and determining which of the components of the object do not contribute to the strength of the structure of the object and are therefore non-structural.

6. The computer-implemented method of claim 1 wherein the step of modeling said significant non-structural masses within each sub-model by adding said significant, non-structural masses to the respective finite element sub-models comprises connecting lumped masses to the finite element sub-models utilizing rigid bars.

7. The computer-implemented method of claim 1 wherein the step of determining the non-structural masses within each sub-model which are insignificant by selecting the non-structural masses within each sub-model which do not exceed at least one of the pre-determined mass or the pre-determined percentage of the mass of the object, and scaling densities of the structural masses in each sub-model of the finite element model to accommodate for the respective insignificant masses within each sub-model comprises scaling said densities of the structural masses in each sub-model of the finite element model by a factor of R, wherein R is calculated by the formula $R = (WT - WM)/WS$, with WT comprising a summation of all structural and non-structural masses in the sub-model, with WM comprising a summation of all significant, non-structural masses in the sub-model, and with WS comprising a summation of all structural masses in the sub-model.

8. The computer-implemented method of claim 1 wherein the method utilizes a multitude of finite element models.

* * * * *